(12) United States Patent
Jin et al.

(10) Patent No.: US 6,784,738 B1
(45) Date of Patent: Aug. 31, 2004

(54) METHOD AND APPARATUS FOR GAIN CONTROL IN A CMOS LOW NOISE AMPLIFIER

(75) Inventors: Xiaodong Jin, Sunnyvale, CA (US); Lawrence Tse, Fremont, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 10/301,349

(22) Filed: Nov. 20, 2002

(51) Int. Cl.[7] .............................................. H03F 3/18
(52) U.S. Cl. ...................... 330/263; 330/265; 330/267; 330/268; 330/272; 330/273
(58) Field of Search ................................ 330/263, 265, 330/267, 268, 272, 273

(56) References Cited

U.S. PATENT DOCUMENTS

| | | | |
|---|---|---|---|
| 5,907,263 A | 5/1999 | Divine et al. | 331/16 |
| 6,100,761 A | 8/2000 | Ezell | 330/254 |
| 6,130,581 A * | 10/2000 | Nevin | 330/289 |
| 6,191,626 B1 | 2/2001 | Prysby et al. | 327/143 |
| 6,194,968 B1 | 2/2001 | Winslow | 330/289 |
| 6,259,323 B1 | 7/2001 | Salminen | 330/285 |
| 6,285,865 B1 | 9/2001 | Vorenkamp et al. | 455/307 |
| 6,313,705 B1 * | 11/2001 | Dening et al. | 330/276 |
| 6,577,114 B1 | 6/2003 | Roo | 324/76.28 |

OTHER PUBLICATIONS

U.S. Ser. No. 10/379,116, filed Mar. 4, 2003, entitled, "Calibration Circuit", pp. 1–37 and 3 sheets if drawings. Attorney Docket No. MP0040.D1.

U.S. Ser. No. 10/379,260, filed Mar. 4, 2003, entitled, "Calibration Circuit", pp. 1–37, and 3 sheets of drawings. Attorney Docket No. MP0040.D2.

Ding, Y. and Harjani, R. (2001) "A +18dBm IIP3 LNA in 0.35•m CMOS," *IEEE International Solid–State Circuits Conference* Session 10 (Wireless Building Blocks), pp. 162–163.

Gatta, F. et al., (Oct. 2001) "A 2–dB Noise Figure 900–MHz Differential CMOS LNA," *IEEE Journal of Solid–State Circuits*, vol. 36, No. 10, pp. 1444–1452.

Gramegna, G. et al. (2000) "Ultra–Wide Dynamic Range 1.75dB Noise–Figure, 900MHz CMOS LNA," *IEEE International Solid–State Circuits Conference* Session 23, 11 pages total.

Gramegna, G. et al. (Jul. 2001) "A Sub–1–dB NF±2.3–kV ESD–Protected 900–MHz CMOS LNA," *IEEE Journal of Solid–State Circuits*, vol. 36, No. 7, pp. 1010–1017.

Karanicolas, A.N. (Dec. 1996) "A 2.7–V 900–MHz CMOS LNA and Mixer," *IEEE Journal of Solid–State Circuits*, vol. 31, No. 12, pp. 1939–1944.

Leroux, P. et al. (2001) "A 0.8dB NF ESD–Protected 9mW CMOS LNA," *IEEE International Solid–State Circuits Conference* Session 26 (Wireless Building Blocks II/0), pp. 410–411.

Leroux, P. et al. (Jun. 2002) "A 0.8–dB NF ESD–Protected 9–mW CMOS LNA Operating at 1.23 GHz," *IEEE Journal of Solid–State Circuits*, vol. 37, No. 6, pp. 760–765.

Zhou, J. and Allstot, D.J. (1998). "A Fully Integrated CMOS 900MHz LNA Utilizing Monolithic Transformers," *IEEE*, vol. 8.6, pp. 1–9.

* cited by examiner

*Primary Examiner*—Michael B. Shingleton

(57) ABSTRACT

An amplifier comprising a Low Noise Amplifier (LNA) to amplify a Radio Frequency (RF) signal. The LNA having a transconductance and including an input stage to receive the RF signal. The LNA again varying as a function of changes in conditions. A bias assembly to generate a bias current to bias the LNA input stage. The bias assembly configured to reduce variation of the LNA gain to changes in conditions.

69 Claims, 4 Drawing Sheets

METHOD AND APPARATUS FOR GAIN CONTROL IN A CMOS LOW NOISE AMPLIFIER

TECHNICAL FIELD

This invention relates to Complementary Metal Oxide Semiconductor (CMOS) low noise amplifiers (LNA).

BACKGROUND

One of the key building blocks of a conventional RF transceiver is a Low Noise Amplifier (LNA). FIG. 1 shows an implementation of a CMOS LNA high gain path 200 commonly adopted in conventional RF transceivers. The gain of this amplifier can be expressed as:

$A_v = g_m \cdot Q^2 \cdot R_p$ where gm is the transconductance of the input device, Q is the quality factor of the load inductor and $R_p$ is the parasitic resistance associated with the inductor.

Referring to the equation above, the gain is a strong function of gm of the input transistor, as well as the Q of the inductor of the LNA. gm may vary +/−30–40%, and the $Q^2 R_p$ term typically varies +/−10–20% due to process, temperature etc. variation. As a result, the gain of the LNA can easily vary by greater than 6 dB. This gain variation may affect receiver performance significantly in real life applications and hence, the implementation may not be desirable.

SUMMARY

An amplifier comprising a Low Noise Amplifier (LNA) to amplify a Radio Frequency (RF) signal. The gain of the LNA varying as a function of changes in the process and environmental conditions. A bias assembly to generate a bias current to bias the LNA input stage. The bias assembly configured to reduce the variation of the LNA gain due to changes in process variations and environmental conditions.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
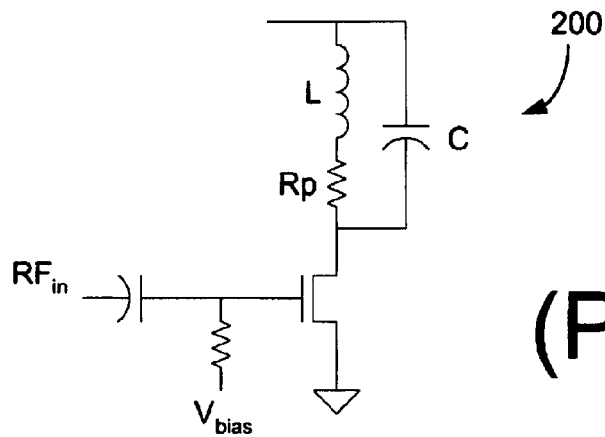
FIG. 1 is a block diagram of a conventional LNA.
Figure 2:
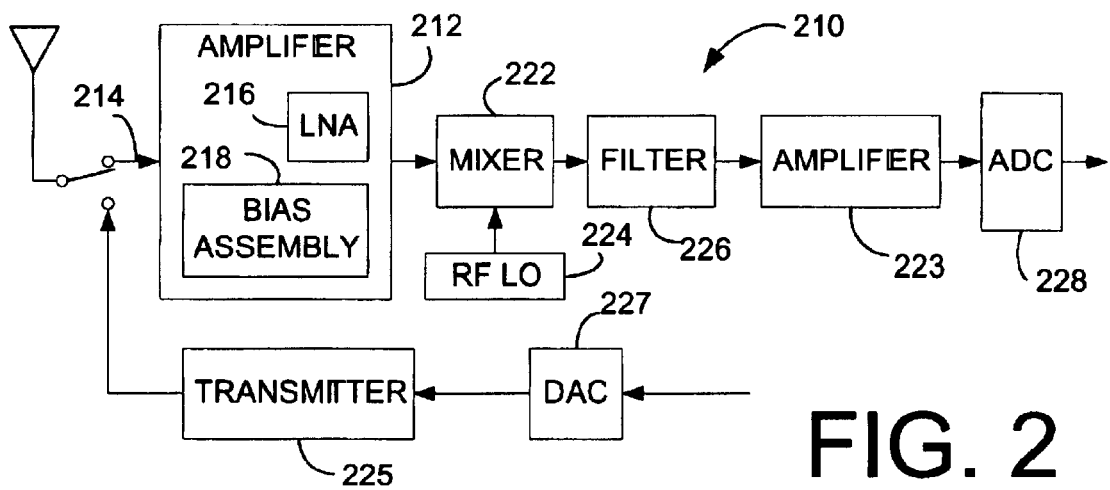
FIG. 2 is a block diagram of an aspect of a transceiver.

FIG. 2 shows an aspect of a wireless transceiver 210 for communicating information. The receive path of the wireless transceiver 210 may include an amplifier 212 for amplifying an input signal 214. The amplifier 212 may include a bias assembly 218 and LNA 216 constructed in accordance with the principles of the invention. A mixer 222 may combine the amplified input signal with a Radio Frequency (RF) LO signal 224. A filter 226 and adjustable amplifier 223 may filter and amplify the combined signal, and mix the generated signal with an Intermediate Frequency (IF) LO signal down to baseband for possibly further amplification and filtering. An analog-to-digital converter (ADC) 228 may convert the mixed signal to a digital signal for further processing.

In the transmit path, a digital-to-analog converter 227 may convert a digital signal to an analog signal for transmission by a transmitter 225.

Figure 3:
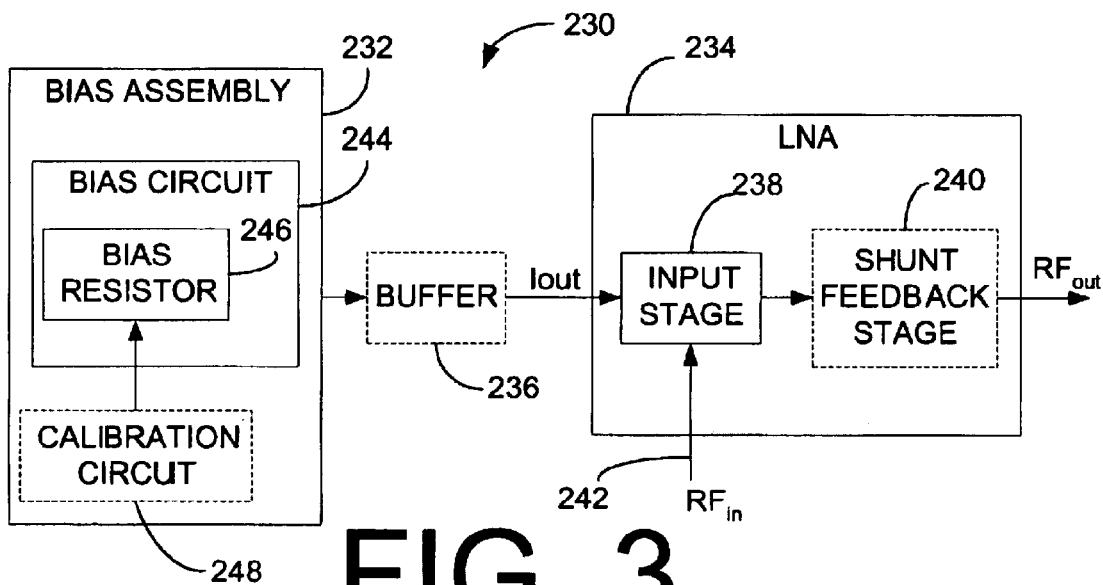
FIG. 3 is a block diagram of an aspect of an amplifier for amplifying an RF signal.

FIG. 3 shows an aspect of an amplifier 230 for generating an RF output. The amplifier 230 is configured to compensate for gain variations that may be caused by process and environmental variations. The amplifier 230 is suitable for assembly as an integrated circuit fabricated with CMOS techniques. The amplifier 230 includes a bias assembly 232 for supplying a bias current, Iout, to an LNA 234. A bias current buffer 236 may be connected between the bias assembly 232 and LNA 234 to level shift and amplify the bias current.

In one aspect, the LNA 234 may include an input stage 238 and a shunt feedback stage 240 to amplify an $RF_{in}$ signal 242. To compensate for gain changes related to resistive component variations in the shunt feedback stage 240, the bias assembly 232 may be configured to have a resistive variation that is about inversely proportional to the shunt feedback stage resistive variation. The bias assembly 232 may, for example, include a bias circuit 244 to generate the bias current as a function of a bias resistor 246, where environmental variations of the bias resistor resistance may partially or completely cancel resistance variations of the shunt feedback stage 240.

In another aspect, the LNA 234 may include an input stage 238 to amplify the $RF_{in}$ signal 242, but not include a shunt feedback stage 240. A bias assembly 232 may include a bias circuit 244 to generate the bias current as a function of a bias resistor 246. The bias resistor 246 may be either an on-chip resistor or an external resistor. If an on-chip resistor is used, the bias assembly 232 may also include a calibration circuit 248 to partially or completely cancel resistance variations of the bias resistor 246.

Figure 4:
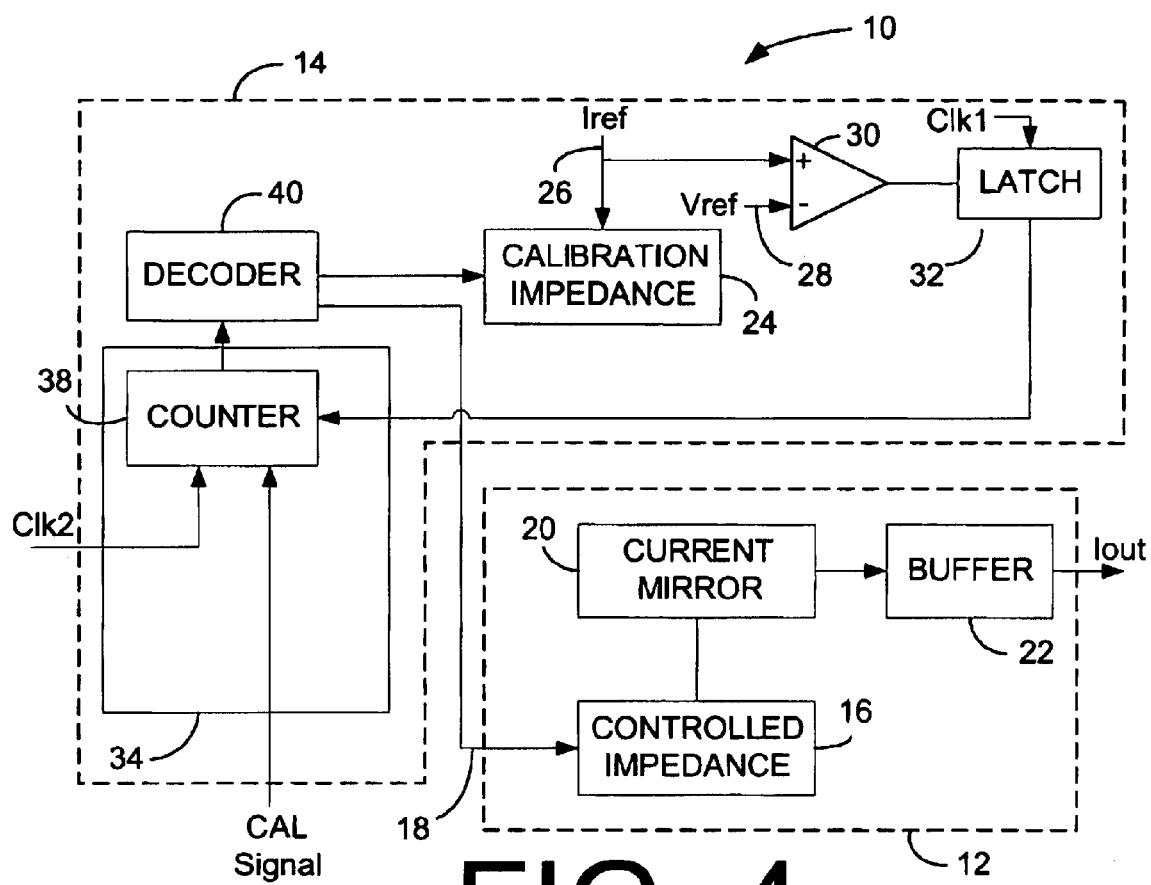
FIG. 4 is a block diagram of an aspect of an LNA biasing scheme.

FIG. 4 shows an aspect of a bias assembly 10 for supplying a bias current, Iout, to an LNA (not shown). The bias assembly 10 is suitable for assembly as an integrated circuit fabricated with CMOS techniques. The bias assembly 10 includes a bias circuit 12 and a calibration circuit 14. The bias circuit 12 generates the bias current as a function of a bias impedance 16. The bias impedance 16 may be controlled in response to a control signal 18 from the calibration circuit 14 to maintain a relatively constant value over variations in operating conditions such as process variations and environmental conditions variations.

Figure 5:
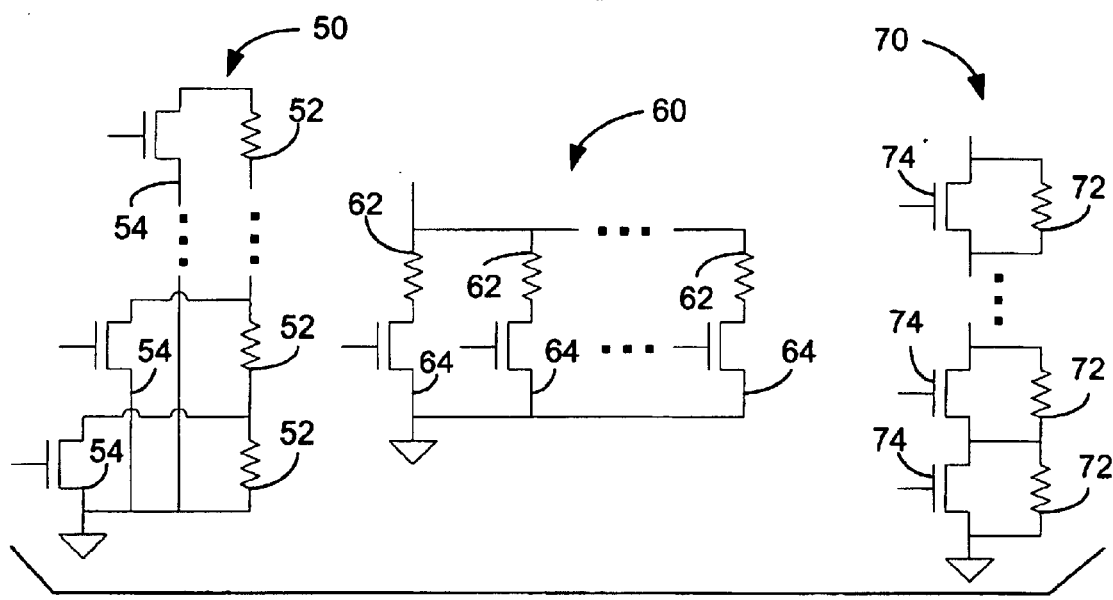
FIG. 5 is a detailed schematic diagram of an aspect of several bias impedance configurations.

Referring to FIG. 5, several configurations of the bias impedance are shown. A hybrid configuration 50 includes a series string of resistors 52 and control transistors 54 that are connected in shunt with one or more of the resistors 52. A series configuration 60 includes a series string of resistors 62 with control transistors 64 that are connected in shunt with each resistor 62. A shunt configuration 70 includes groupings of a resistor 72 connected in series with a control transistor 74 and the series combinations of resistor-transistor connected in shunt. The resistors in each of the configurations may be made from any suitable material including N+ poly and P+ poly.

Referring to FIG. 4, a bias voltage that may include temperature and process compensation is applied across the bias impedance 16 to generate the bias current. The bias current is supplied to a current mirror 20 that may reflect the bias current to a buffer 22. The buffer 22 supplies the bias current to an LNA (not shown) and may be configured as either a P Metal Oxide Semiconductor (PMOS) or an NMOS current mirroring gain buffer. The device characteristics of the buffer 22 may be varied in relation to the current mirror 20 to change the amplitude of the bias current supplied by the buffer 22. For example, the size of the buffer 22 may be varied relative to the current mirror to cause a corresponding change in the current supplied.

The calibration circuit 14 may determine the effect of process and environmental variations on a calibration impedance 24 such as a poly resistor. The calibration impedance 24 preferably is constructed from similar material, has a similar configuration, and is located in close proximity to the bias impedance 16 so that changes in the calibration impedance 24 may track changes in the bias impedance 16. A reference current, Iref, 26 may be applied to the calibration impedance 24 to generate a calibration voltage that is compared to a reference voltage, Vref, 28. The reference current 26 may be generated from a fixed voltage such as the reference voltage 28 and a fixed resistor that maintains a predictable value over process and environmental variations. A comparator 30 monitors changes in the calibration impedance 24 relative to the voltage reference 28. A latch 32 may latch the output of the comparator 30 synchronous to a clock. A calibration control circuit 34 may delay the latch output to reduce the impact of noise generated at the clock edges. The calibration control circuit 34 may include control logic and a up/down counter 38. A calibration signal, CAL, enables the calibration control circuit 34. A clock signal, Clk2, provides a timing reference for the counter 38. A decoder 40 interprets the signal from the calibration control circuit 34 and in response may control the resistance of the calibration impedance 24 by enabling or disabling control transistors.

Figure 6:
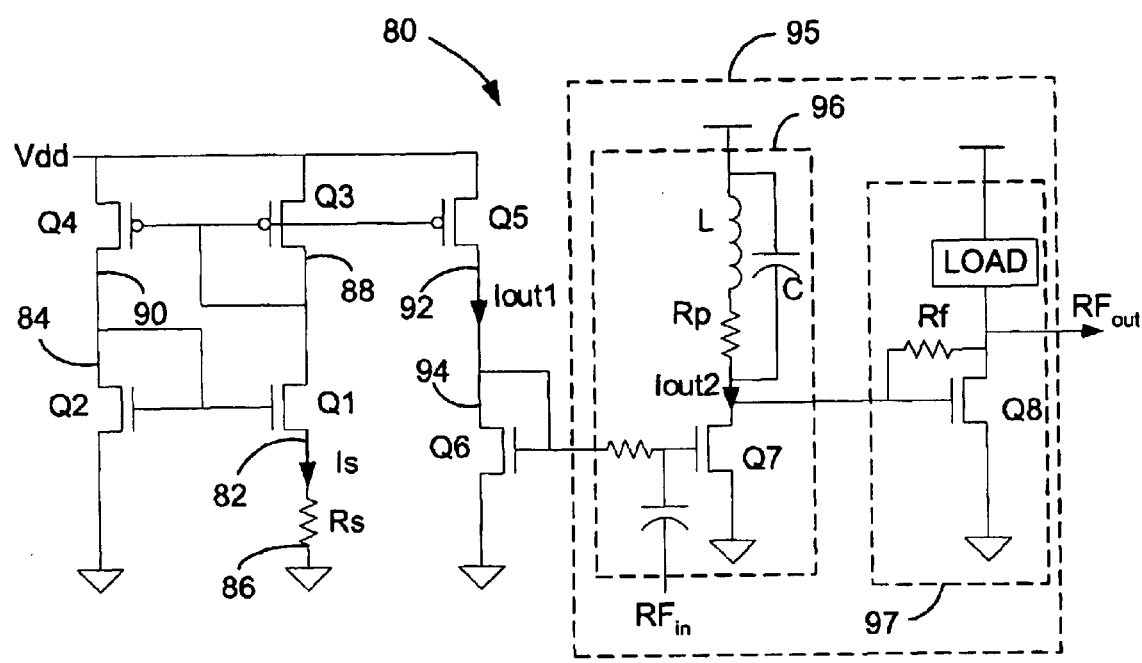
FIG. 6 is a detailed schematic diagram of an aspect of a bias circuit for an LNA.

FIG. 6 shows an aspect of a bias circuit 80 for generating an LNA bias current. The bias circuit 80 may include a PMOS current mirror pair, Q3 and Q4, and a pair of NMOS transistors, Q1 and Q2, 82 and 84 for generating a controlled current, Is, through a resistor, Rs, 86. A size ratio, K, of Q1 and Q2 is selected to provide a desired current amplitude of Is. The following equations show the relation between the transconductance of Q1 and Rs, if the currents flowing through Q1 and Q2 are equal, $$\sqrt{\frac{2I_s}{\mu C\frac{W}{L}}} + V_{TH1} = \sqrt{\frac{2I_s}{\mu C\left(\frac{W}{L}\right) \cdot K}} + V_{TH2} + I_s \cdot R_s$$

Canceling $V_{TH1}$ and $V_{TH2}$ and rearranging terms;

$$I_s = \frac{2}{\mu C\left(\frac{W}{L}\right)} \cdot \frac{1}{R_s^2}\left(1 - \frac{1}{\sqrt{K}}\right)^2 \qquad \text{Equation 1}$$

The pair of PMOS transistors, Q3 and Q4, 88 and 90 may be selected to have the same size so that the currents flowing through drains of Q1 and Q2 are substantially equal. With equal currents in Q1 and Q2, the relationship described by Equation 1 is maintained. A buffer 92 is preferably the same type of transistor as Q3 and Q4, 88 and 90, and may be sized in relation to Q3 to vary the amplitude of current, $I_{out1}$, flowing from the buffer 92. For example, if the buffer 92 is selected to be three times larger than Q3, then $I_{out1}$ will be three times larger than Is. A current mirror 94 including transistors Q6 and Q7 may be connected to the buffer 92 to set a bias current, $I_{out2}$, of an LNA 95. The ratio of the sizes of Q6 and Q7 may be varied to change the amplitude of $I_{out2}$ with respect to $I_{out1}$.

If the size ratio of Q5 and Q3 is M and the ratio of Q7 and Q6 is N, then the bias current $I_{out}$ flowing into Qr. Will be:

$$I_{out2} = MNI_s = \frac{2MN}{\mu C\left(\frac{W}{L}\right)} \cdot \frac{1}{R_s^2}\left(1 - \frac{1}{\sqrt{K}}\right)^2$$

Solving for $g_{m, Q7}$ $$g_{m,Q7} = \sqrt{2\mu C\left(\frac{W}{L}\right) \cdot I_{out2}} = \frac{2\sqrt{MN}}{R_s}\left(1 - \frac{1}{\sqrt{K}}\right)$$

It can be seen that the transconductance of the LNA input stage is predominantly dependent on the resistor value Rs. Rs may be implemented as an external resistor or an on chip resistor. If Rs is implemented as an on chip resistor, then the resistance value of Rs will vary with process and environmental variations. The variation of the LNA gain to process and environmental changes may be reduced by using any of several techniques including 1) a calibration scheme to reduce the variation of Rs with process and environmental changes, and 2) adding a shunt feedback stage to cancel out the resistor variation.

In one aspect, the LNA 95 may include an input stage 96 to amplify an RF input signal, $RF_{in}$. Recall that the gain of the LNA is:

$$A_v = g_m \cdot Q^2 \cdot R_p \propto \frac{Q^2 R_p}{R_s}$$

Since Rs will be calibrated, the $Q^2Rp$ term becomes the dominant contributor of gain variation, varying by about 10%–20%.

In another aspect, the LNA 95 may also include a shunt feedback stage 97 connected to the input stage 96 to further amplify $RF_{in}$. The gain of this LNA can be expressed as:

$$A_v = g_m \cdot R_f \propto \frac{R_f}{R_s},$$

where Rf is the shunt feed back resistor. If Rf is chosen to be the same type of resistor as Rs, a good match can be achieved, leading to improved gain accuracy.

Figure 7:
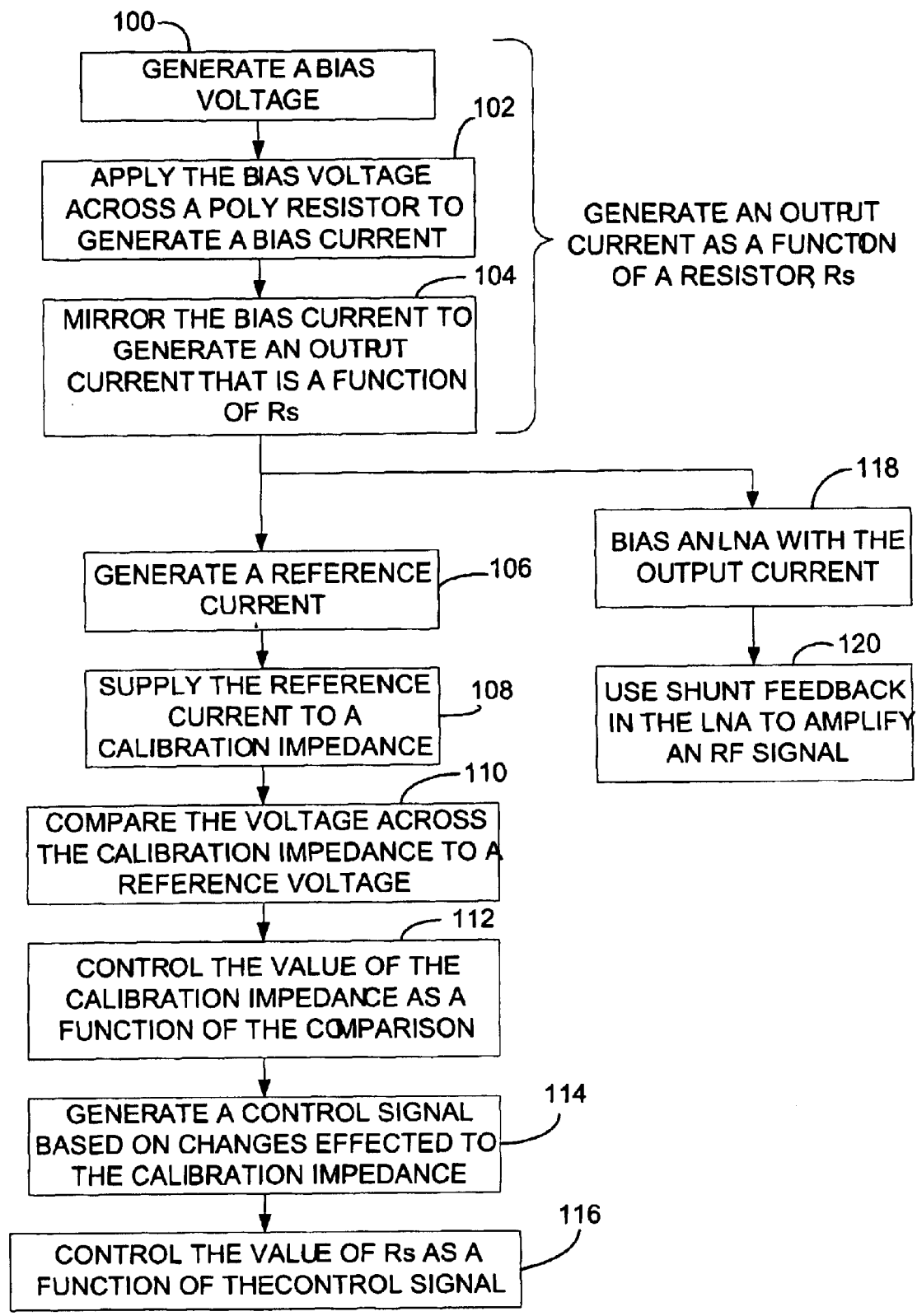
FIG. 7 is a flow diagram of an aspect of generating a bias current for an LNA.

FIG. 7 shows an operation for amplifying an RF signal. Starting at block 100, a bias voltage may be generated by a two transistor circuit. The bias voltage may be equal to the difference between the Vgs voltages of the two transistors. At block 102, the bias voltage is applied across a bias impedance to generate a bias current. The bias impedance may be controllable and may include one or more poly resistors in combination with switches. The magnitude of the bias current may be a function of the poly resistors and the physical characteristics of the two transistors including size ratio, width, length, and capacitance. At block 104, the bias current is mirrored to generate an output current that is a function of the poly resistance.

In one aspect, at block 106, a reference current is generated. At block 108, the reference current is supplied to a controlled calibration impedance that may include several poly resistors in combination with switches. At block 110, the voltage developed across the controlled calibration impedance may be compared to a reference voltage. At block 112, the impedance of the controlled calibration impedance may be controlled as a function of the comparison to reduce the difference between the reference voltage and the voltage developed across the controlled calibration impedance. Different ones of the control switches are turned on or off to effect the desired control. At block 114, a control signal may be generated to indicate the change in the controlled calibration impedance that cancels the difference between the reference voltage and the voltage developed across the controlled calibration impedance. The control signal may indicate the state of each of the control switches. At block 116, the impedance of the controlled bias impedance may be controlled in response to the control signal so that changes in the poly resistance are compensated for by effecting the same changes to the controlled bias impedance that are affected for the controlled calibration impedance. Variations in the resistance of the poly resistors caused by process, environmental conditions, and operating conditions may be compensated for by controlling for the change in resistance of the controlled calibration impedance poly resistors and mirroring that control to the controlled bias impedance poly resistors. By compensating for changes in the resistance of the poly resistors, the transconductance of the LNA may be held constant over process variations and environmental conditions resulting in a relatively constant LNA gain, with the dominant variation resulting from the effective impedance from the inductor tank.

In another aspect, continuing from block 104 to block 118 an LNA is biased with the output current. The LNA may include an input stage to receive an RF input signal. At block 120, a portion of the amplified RF input signal may be communicated to the input stage using a shunt resistor to provide feedback. Variations in the shunt resistor may be compensated for by variations in the bias impedance to cause the gain of the amplifier to be substantially independent of changes in conditions that affect the values of the resistors.

A number of embodiments of the invention have been described. Nevertheless, it will be understood that various modifications may be made without departing from the spirit and scope of the invention. Accordingly, other embodiments are within the scope of the following claims.

What is claimed is:

1. An amplifier, comprising:
   a Low Noise Amplifier (LNA) to amplify a Radio Frequency (RF) signal, the LNA having a transconductance and a gain and including an input stage to receive the RF signal, the LNA gain varying as a function of changes in conditions;
   a bias assembly to generate a bias current to bias the LNA input stage, the bias assembly configured to reduce variation of the gain of the LNA that is a function of changes in conditions, wherein bias assembly includes a bias circuit with a bias impedance, and wherein the bias current is a function of the bias impedance; and
   a calibration circuit that monitors changes in a calibratio that controls the bias impedance as a function of the changes in the calibration impedance.

2. The amplifier of claim 1 wherein the bias circuit includes a first transistor coupled to the bias impedance, wherein the bias impedance is controlled in response to changes in conditions to reduce variation of the LNA transconductance to changes in conditions, and wherein the variation of the LNA gain that is a function of changes in conditions is reduced.

3. The amplifier of claim 1 wherein the conditions include process, temperature, environmental, and power variations.

4. The amplifier of claim 1 wherein the calibration impedance includes resistors and transistors arranged in a configuration; and
   the bias impedance includes resistors and transistors arranged in a configuration.

5. The amplifier of claim 4 wherein the calibration impedance resistors and the bias impedance resistors include poly resistors.

6. The amplifier of claim 4 wherein the calibration impedance configuration and the bias impedance configuration are the same.

7. The amplifier of claim 4 wherein the calibration impedance configuration and the bias impedance configuration are selected from a group consisting of a hybrid configuration, a series configuration, and a shunt configuration.

8. The amplifier of claim 1 wherein the calibration impedance is located in close proximity to the bias impedance so that the conditions of the calibration impedance mirror the conditions of the bias impedance.

9. The amplifier of claim 2 wherein the bias circuit further includes:
   a second transistor having a gate, a source, and a drain, the second transistor gate and drain connected together and connected to a gate of the first transistor;
   a source of the first transistor connected to a first end of the bias impedance; and
   the second transistor source connected to a second end of the bias impedance.

10. The amplifier of claim 9 wherein the bias circuit further includes a current mirror connected to the first transistor drain and the second transistor drain, the current mirror to supply a bias current.

11. The amplifier of claim 10 wherein the bias circuit further includes a bias current buffer connected to the current mirror to supply a buffered current that is a function of the bias current.

12. The amplifier of claim 10 wherein the current mirror includes:
   a third transistor having a size, connected to the first transistor drain; and
   a fourth transistor having a size, connected to the second transistor drain, the fourth transistor size equal to the third transistor size.

13. The amplifier of claim 2 wherein the LNA further comprises a shunt feedback stage to amplify an output of the LNA input stage and to generate an RF output, the shunt feedback stage including a shunt resistor to feed back a portion of the RF output; and
   changes in the bias impedance to compensate for changes in the shunt resistor to reduce the variation of the gain of the LNA that is a function of changes in conditions.

14. The amplifier of claim 13 wherein the conditions include process, temperature, environmental, and power variations.

15. The amplifier of claim 13 wherein the bias circuit further includes a second transistor having a gate, a source, and a drain, the second transistor gate and drain connected together and connected to a gate of the first transistor;
   a source of the first transistor connected to a first end of the bias impedance; and
   the second transistor source connected to a second end of the bias impedance.

16. The amplifier of claim 15 wherein the bias circuit further includes a current mirror connected to the first transistor drain and the second transistor drain, the current mirror to supply a bias current.

17. The amplifier of claim 16 wherein the bias circuit further includes a bias current buffer connected to the current mirror to supply a buffered current that is a function of the bias current.

18. A method of amplifying an input signal, comprising:
providing a Low Noise Amplifier (LNA) to receive and amplify the input signal;
generating a bias current as a function of a bias impedance;
supplying the bias current to the LNA;
compensating for changes in the bias impedance to reduce LNA gain variations caused by changes in conditions by measuring variation of a calibration impedance in response to changes in conditions and controlling a value of the bias impedance based on the measured calibration impedance variation; and
amplifying the input signal.

19. The method of claim 18 wherein the conditions include process, temperature, and power variations.

20. The method of claim 18 wherein the calibration impedance includes resistors and transistors arranged in a configuration; and
the bias impedance includes resistors and transistors arranged in a configuration.

21. The method of claim 20 wherein the calibration impedance resistors and the bias impedance resistors include poly resistors.

22. The method of claim 21 further comprising selecting the calibration impedance configuration and the bias impedance configuration to be the same.

23. The method of claim 20 wherein the calibration impedance configuration and the bias impedance configuration are selected from a group consisting of a hybrid configuration, a series configuration, and a shunt configuration.

24. The method of claim 18 further comprising locating the calibration impedance in close proximity to the bias impedance so that the operating conditions of the calibration impedance mirror the operating conditions of the bias impedance.

25. The method of claim 18 further comprising connecting a first transistor, the bias impedance, and a second transistor in series such that the bias impedance is connected between a source of the first transistor and a source of the second transistor.

26. The method of claim 25 further comprising supplying a bias current to the first transistor and the second transistor.

27. The method of claim 26 further comprising generating a buffer current as a function of the bias current.

28. The method of claim 18 wherein the LNA has a transconductance; wherein amplifying includes feeding back a portion of the amplified input signal; and wherein compensating for changes in the bias impedance includes using variations in the bias impedance to compensate for variations in the LNA transconductance that are a function of the changes in conditions.

29. The method of claim 28 wherein feeding back includes resistively communicating the portion of the amplified input signal.

30. The method of claim 29 wherein resistively communicating includes using a shunt resistor.

31. The method of claim 30 wherein compensating for changes in the bias impedance includes canceling variations in the shunt resistor with variations in the bias impedance.

32. The method of claim 28 wherein the conditions include process, temperature, and power variations.

33. An amplifier, comprising:
means for amplifying a Radio Frequency (RF) signal, the RF signal amplifying means having a transconductance and a gain and including input stage means for receiving the RF signal, the gain of the RF signal amplifying means varying as a function of changes in conditions;
means for biasing the input stage means, the biasing means configured to reduce variation of the gain of the RF signal amplifying means that is a function of changes in conditions, wherein the biasing means includes generating means that includes a bias impedance for generating a bias current as a function of the bias impedance; and
calibration means for monitoring changes in a calibration impedance and for controlling the bias impedance as a function of the chances in the calibration impedance.

34. The amplifier of claim 33 wherein the biasing means includes first means for amplifying coupled to the bias impedance, wherein the bias impedance is controlled in response to changes in conditions to reduce variation of the gain of the first amplifying means to changes in conditions, and wherein the variation of the gain of the RF signal amplifying means to changes in conditions is reduced.

35. The amplifier of claim 33 wherein the conditions include process, temperature, environmental, and power variations.

36. The amplifier of claim 33 wherein the calibration impedance includes resistors and transistors arranged in a configuration; and
the bias impedance includes resistors and transistors arranged in a configuration.

37. The amplifier of claim 36 wherein the calibration impedance resistors and the bias impedance resistors include poly resistors.

38. The amplifier of claim 36 wherein the calibration impedance configuration and the bias impedance configuration are the same.

39. The amplifier of claim 36 wherein the calibration impedance configuration and the bias impedance configuration are selected from a group consisting of a hybrid configuration, a series configuration, and a shunt configuration.

40. The amplifier of claim 33 wherein the calibration impedance is located in close proximity to the bias impedance so that conditions of the calibration impedance mirror conditions of the bias impedance.

41. The amplifier of claim 34 wherein the generating means further includes a second means for amplifying having a gate, a source, and a drain, the second amplifying means gate and drain connected together and connected to a gate of the first amplifying means;
a source of the first amplifying means connected to a first end of the bias impedance; and
the second amplifying means source connected to a second end of the bias impedance.

42. The amplifier of claim 41 wherein the generating means further includes a means for current mirroring connected to the first amplifying means drain and the second amplifying means drain, the current mirroring means to supply a bias current.

43. The amplifier of claim 42 wherein the generating means further includes a means for bias current buffering connected to the current mirroring means to supply a buffered current that is a function of the bias current.

44. The amplifier of claim 42 wherein the current mirroring means includes;

third means for amplifying having a size, connected to the first amplifying means drain; and fourth means for amplifying having a size, connected to the second amplifying means drain, the fourth amplifying means size equal to the third amplifying means size.

45. The amplifier of claim 34 wherein the RF signal amplifying means further comprises means for shunt feedback to amplify an output of the input stage means and to generate an RF output, the shunt feedback means including a shunt resistor to feed back a portion of the RF output; and wherein changes in the bias impedance compensate for changes in the shunt resistor to reduce the variation of the gain of the LNA that is a function of changes in conditions.

46. The amplifier of claim 45 wherein the conditions include process, temperature, environmental, and power variations.

47. The amplifier of claim 45 wherein the generating means further includes:

second means for amplifying having a gate, a source, and a drain, the gate and drain of the second means for amplifying connected together and connected to a gate of the first means for amplifying;

a source of the first means for amplifying connected to a first end of the bias impedance; and the source of the second means for amplifying connected to a second end of the bias impedance.

48. The amplifier of claim 45 wherein the generating means further includes a means for current mirroring connected to the first transistor drain and the second transistor drain, the current mirroring means to supply a bias current.

49. The amplifier of claim 46 wherein the generating means further includes a means for bias current buffering connected to the current mirroring means to supply a buffered current that is a function of the bias current.

50. An amplifier, comprising:

a Low Noise Amplifier (LNA) that has an input stage that receives Radio Frequency (RF) signals, a transconductance, and gain that varies as a function of changes in conditions; and a bias circuit that has a bias impedance and that generates a bias current for said LNA input stage based on said bias impedance; and a calibration circuit that monitors changes in a calibration impedance, that adjusts the bias impedance as a function of the changes in the calibration impedance, and that reduces variation of the LNA gain based on said changes in conditions.

51. The amplifier of claim 50 wherein said calibration circuit further comprises a control loop that selectively increments and decrements a counter value based upon a comparison between a calibration voltage, which is based on said calibration impedance, and a reference voltage.

52. The amplifier of claim 51 wherein said calibration circuit further comprises a decoder that communicates with said control loop and that adjusts said calibration impedance based on said counter value.

53. The amplifier of claim 51 wherein said calibration circuit further comprises a decoder that communicates with said control loop and that adjusts said bias impedance based on said counter value.

54. The amplifier of claim 51 wherein said calibration circuit further comprises a reference current source that generates a reference current, wherein said calibration voltage is based on said reference current and said calibration impedance.

55. The amplifier of claim 52 wherein said calibration impedance is adjusted using a first set of switches, wherein said decoder selectively controls said first set of switches to adjust said calibration impedance.

56. The amplifier of claim 53 wherein said bias impedance is adjusted using a second set of switches, wherein said decoder selectively controls said second set of switches to adjust said bias impedance.

57. The method of claim 18 further comprising selectively incrementing and decrementing a counter value based upon a comparison between a calibration voltage, which is based on said calibration impedance, and a reference voltage.

58. The method of claim 57 further comprising adjusting said calibration impedance based on said counter value.

59. The method of claim 57 further comprising adjusting said bias impedance based on said counter value.

60. The method of claim 57 further comprising:

generating a reference current; and basing said calibration voltage on said reference current and said calibration impedance.

61. The method of claim 58 further comprising using a first set of switches to adjust said calibration impedance.

62. The method of claim 59 further comprising using a second set of switches to adjust said bias impedance.

63. An amplifier, comprising:

amplifying means for amplifying Radio Frequency (RF) signals and that has an input stage, a transconductance, and gain that varies as a function of changes in conditions;

bias means for generating a bias current for said LNA input stage based on a bias impedance; and calibration means for monitoring changes in a calibration impedance, for adjusting the bias impedance as a function of the changes in the calibration impedance, and for reducing variation of the LNA gain based on said changes in conditions.

64. The amplifier of claim 63 wherein said calibration means further comprises control loop means for selectively incrementing and decrementing a counter value based upon a comparison between a calibration voltage, which is based on said calibration impedance, and a reference voltage.

65. The amplifier of claim 64 wherein said calibration means further comprises decoding means that communicates with said control loop means for adjusting said calibration impedance based on said counter value.

66. The amplifier of claim 64 wherein said calibration means further comprises decoding means that communicates with said control loop means for adjusting said bias impedance based on said counter value.

67. The amplifier of claim 64 wherein said calibration means further comprises reference generating means for generating a reference current, wherein said calibration voltage is based on said reference current and said calibration impedance.

68. The amplifier of claim 65 wherein said calibration impedance is adjusted using a first set of switches, wherein said decoding means selectively controls said first set of switches to adjust said calibration impedance.

69. The amplifier of claim 66 wherein said bias impedance is adjusted using a second set of switches, wherein said decoding means selectively controls said second set of switches to adjust said bias impedance.

* * * * *